United States Patent [19]

Brendzel

[11] 3,745,315

[45] July 10, 1973

[54] RIPPLE-THROUGH COUNTERS HAVING MINIMUM OUTPUT PROPAGATION DELAY TIMES

[75] Inventor: Henry T. Brendzel, Parsippany, N.J.

[73] Assignee: Bell Telephone Laboratories, Incorporated, Murray Hill, N.J.

[22] Filed: Mar. 26, 1971

[21] Appl. No.: 128,548

Related U.S. Application Data

[62] Division of Ser. No. 861,433, Sept. 26, 1969, Pat. No. 3,613,088.

[52] U.S. Cl. ............ 235/92 LG, 328/48, 235/92 R, 235/92 PE

[51] Int. Cl. ............ H03k 21/36

[58] Field of Search ............ 235/92 BD, 92 LG, 235/92 B, 92 PE; 328/48

[56] References Cited

UNITED STATES PATENTS

| | | | |
|---|---|---|---|
| 3,050,685 | 8/1962 | Stuart | 235/92 PE |
| 3,594,551 | 7/1971 | Shearer et al. | 235/92 PE |
| 2,527,633 | 10/1950 | Grignon | 235/92 PE |

*Primary Examiner*—Maynard R. Wilbur
*Assistant Examiner*—Joseph M. Thesz, Jr.
*Attorney*—William L. Keefauver et al.

[57] ABSTRACT

A ripple-through binary counter having minimum output propagation delay time is disclosed. The process for constructing the counter utilizes the desired values of loop length, clock frequency and single-stage delay time to specify the number of stages in the counter, the terminal state of the counter, and the logic gate configuration required to reset the counter from its terminal state to its initial state. A counter constructed in accordance with this process has a minimum propagation delay before producing an output.

3 Claims, 1 Drawing Figure

Patented July 10, 1973 3,745,315
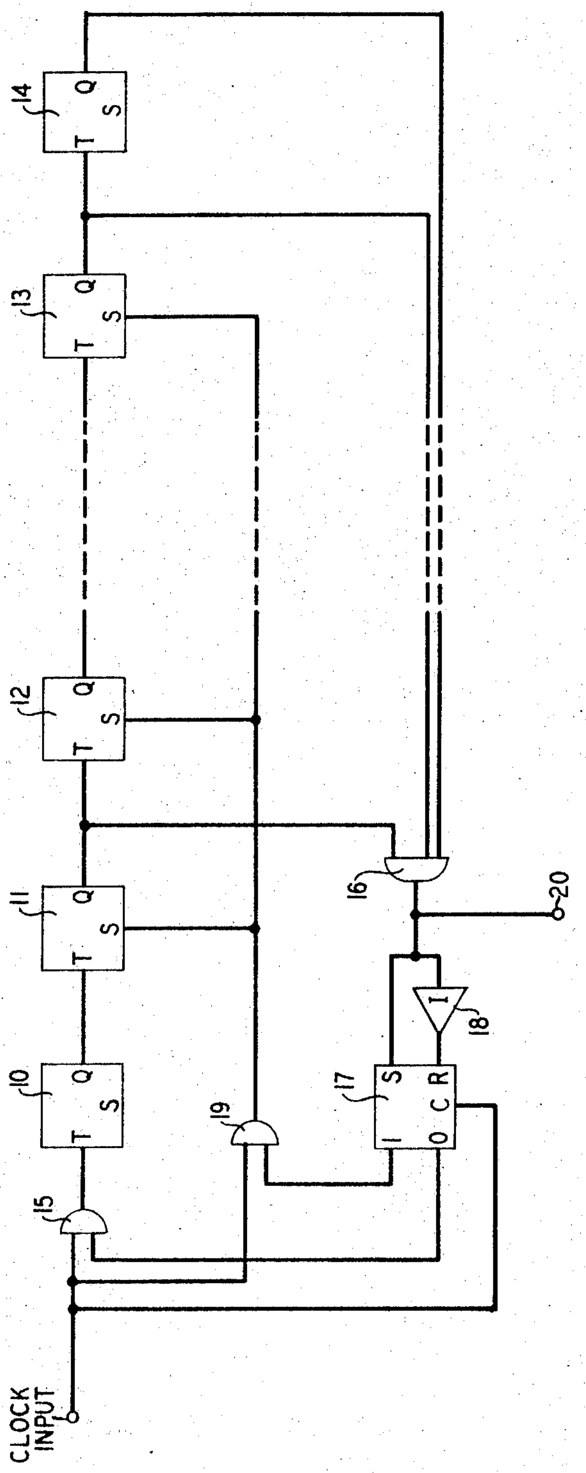

RIPPLE-THROUGH COUNTERS HAVING MINIMUM OUTPUT PROPAGATION DELAY TIMES

This is a division of application Ser. No. 861,433, filed Sept. 26, 1969 now Pat. No. 3,613,088.

GOVERNMENT CONTRACT

The invention herein claimed was made in the course of, or under contract with the Department of the Navy.

BACKGROUND OF THE INVENTION

1. Field of the Invention

This invention relates to the construction of synchronous circuits and, particularly, to the construction of ripple-through counters.

2. Description of the Prior Art

Recent years have seen a vast increase in the manufacture and use of digital circuitry to perform computing and control functions. Most of this digital circuitry operates synchronously, that is, in a particular timed sequence. The timing sequences required by synchronous digital circuits are supplied by one or more timing circuits, known as clocks, that generate control pulses at a predetermined rate. Often, a high frequency oscillator is used as the system clock and counting circuits, triggered by the system clock, are used to supply lower frequency timing signals. Each counting circuit is designed to generate one output pulse for every N input pulse where N is determined by the desired timing freqeuncy.

The counters most frequently used in timing applications are clocked counters and ripple-through counters. Clocked counters generally count in a continuous binary sequence, offering the advantage of having their output be a binary representation of the number of pulses counted. The input of each stage of a clocked counter includes the clock pulse and the outputs from all preceding stages. Although this arrangement results in only a single-stage delay in transferring from any state to the next state, it also requires increased circuit complexity in each succeeding stage. Further, it raises clock distribution problems at very high frequencies because each counter stage presents a load to the clock.

Ripple-through counters have only a single input per stage: the output of the previous stage. The clock signal is only applied to the first stage of a ripple-through counter resulting in only a single-stage load on the clock. However, this type of counter suffers from the disadvantage that the settling time between inputs varies from a single-stage delay to an N stage delay, depending upon the number of stages a particular input has to ripple through. This disadvantage has heretofore eliminated ripple-through counters from use in high-speed synchronous circuit design. Clocked counters, despite their increased complexity were used so that minimum delay in the propagation of output pulses will be achieved.

It is an object of this invention to provide a machine-implemented process suitable for use in constructing high-speed counters which combine the best features of both clocked counters and ripple-through counters.

It is a specific object of this invention to provide ripple-through counters having minimum output propagation delay times.

SUMMARY OF THE INVENTION

In accordance with these objects, the invention uses desired values of loop length, clock frequency, and single-stage delay time to design a ripple-through counter having an output propagation delay time equal to the single-stage delay time.

The process chooses the counter's terminal state in accordance with the clock frequency and single-stage delay time such that the counter settles completely to its terminal state in a minimum time after the input of the last pulse to be counted in a particular cycle. The counter's initial state is determined by adding the loop length to the chosen terminal state. These two states are then adjusted so as to minimize the logic circuitry required to reset the counter at the end of each counting cycle.

BRIEF DESCRIPTION OF THE DRAWING

FIG. 1 is a generalized representation of a counter in accordance with this invention.

DETAILED DESCRIPTION

The invention may best be understood by a consideration of the operation of the type of ripple-through counter that may be designed by using the invention.

The counter changes state each time an input pulse is applied. A counting cycle comprises beginning at an initial state, counting a predetermined number of inputs, sensing the terminal state, and setting particular bits so as to return to the initial state. In order to achieve the objects hereinbefore stated, the terminal state must be such that the counters' output occurs in a minimum time after the last pulse to be counted, and the initial and terminal states must be chosen so that the transition from the terminal state to the initial state may be achieved quickly and simply.

In order to obtain the desired minimum output propagation delay time, the terminal state must have the shortest propagation delay possible. The shortest propagation delay (SPD) that it is possible for a counter to have is the delay of a single stage plus the propagation delay of its associated sensing gate. A ripple-through counter has many SPD states because all states that represent a binary odd number are SPD states when the frequency of operation is relatively low. Binary odd numbers are SPD states because changing from any even number to the next number requires only a single stage to change. For example, 00011 in a five-stage counter is an SPD state because the change from 00010 to 00011 requires only the first stage to change state.

At very high frequencies some odd states are not SPD states. For example, 0000000001 in a ten-stage counter may not be an SPD state at 50 MHz because, while the least significant flip-flop may have changed and settled down after the last clock pulse, other flip-flops could still be changing as a result of the next to last clock pulse. Specifically, if the propagation delay per stage is 5 nanoseconds and if the counter is at state 1111111111 and then 2 clock pulses appear, 5 nanoseconds after the second pulse has occurred the state of the counter is 1111100001 and still changing toward 0000000001. This indicates that at high speeds a better choice for a terminal state would be a state having an additional "1" positioned so as to terminate the ripple, as for example, 0000010001.

The precise choice of a terminal state is dependent not only upon the requirement of shortest output propagation delay but also upon the requirement that the amount of logic circuitry used to preset the counter to the initial state from the terminal state be minimized. The relationship between the initial and terminal states of the counter is determined by the loop length, that is, the number of inputs that must be counted per counting cycle.

When the loop length, L, is known, the number of stages, S, required to implement the counter can be found by choosing the smallest value of S such that $$L \leq 2^S. \quad (1)$$

The number of unused counter states, U, is then $$U = 2^S - L. \quad (2)$$

In order to return to the initial state following a counting cycle the counter must jump over thse unused states. Due to the synchronous nature of the counter the time required to preset the counter must be considered. To insure that the counter will be preset properly, the first clock pulse period in each new counting cycle is used to perform the presetting. This requires the presetting operation to jump over what would normally be the counter's initial state. The jump size, $J$, is therefore one more than the number of unused states:

$$J = 2^S - L + 1. \quad (3)$$

The jump size algebraically added to the terminal state value is the initial state. In implementing the counter, logic circuitry must be provided that resets particular bits in the terminal state so as to effectively perform this addition and return to the initial state. The invention, as will now be described, utilizes the bit pattern of the binary representation of $J$ to determine which bits must be reset.

If the terminal state were chosen to be zero, the "1's" in the binary representation of $J$ would indicate the locations in the terminal state that have to be set from "0" to "1" in order to reach the initial state. However, as previously indicated, the terminal state can not be zero but rather must have at least a "1" in the least significant bit and possibly additional "1's" in more significant bit positions to insure that the terminal state has the SPD quality. These "1's" pose a problem if $J$ has a "1" in the same position since it means that the bit in that position has to be reset to a "0," thus generating a ripple. The correct state of the next most significant position will then be dependent upon its value prior to the presetting operation and upon the fact that a ripple was generated. The problem associated with the extra "1" in the terminal state can be eliminated by positioning the "1" in the terminal state so that it does not coincide with a "1" in the same bit position of $J$. The problem posed by the "1" in the least significant bit position of the terminal state can be circumvented in one of two ways, depending upon whether, in a particular case, $J$ is even or odd.

If L is odd then J is even, and the initial state will be odd since the terminal state is odd. Therefore, the least significant bit of the terminal state need not be changed in those counters for which $J$ is even. Furthermore, it must remain a "1" during the preset cycle and so the normal clock input pulse must be inhibited. Presetting is completed by setting to a "1" those counter stages indicated by the remaining "1's" in the binary representation of $J$.

When L is even J is odd, the initial state will be even and hence the least significant bit of the terminal state must be reset to a "0." This may be easily accomplished by not inhibiting the clock input pulse that occurs during the preset cycle which eliminates the "+1" term in Equation (3), yielding $J = 2^S - L$. The inclusion of the clock pulse, however, causes a ripple to be propagated into the second stage of the terminal state. If the second least significant bit of $J$ is a "0," indicating that the second stage of the terminal state need not be reset, the ripple will terminate at the second stage and the remaining bits of $J$ will indicate those remaining bits of the terminal state that must be preset. The occurrence of "0" in the second least significant bit of J indicates that L, though even, is not divisible by 4.

If $J$ contains a string of "1's" starting with the second least significant bit, ($L$ divisible by 4) it is obvious that algebraically adding $J$ to the terminal state would cause a ripple to propagate through the string of "1's" resulting in the initial state having "0's" in the corresponding bit position. Thus the "1's" in $J$ no longer represent the bits to be set. This difficulty can be obviated by insuring that the ripple stops in the second stage. This can be done by changing the terminal state through the addition of a "1" in the second least significant bit. To preserve the proper loop length, the initial state must also be changed. This is accomplished by using $J$+3 in place of $J$ to indicate those terminal state bits that must be reset. The "+3" is necessary because, as previously mentioned, the bits of $J$ accurately indicate which terminal state bits must be reset only in case the terminal state is all zeros. Since the terminal state now has "1's" in the two least significant bit positions, +3 must be added to $J$ so that when $J$ is effectively added to the terminal state by the logic circuitry the correct initial state will result. In other words, J can be expressed by $2^S - L + 4$.

These modifications to the terminal state and to $J$ in the case where $J$ contains a string of "1's" starting with the second least significant bit have the following result: the clock pulse is not inhibited during the preset cycle and the "1's" in the binary representation of $J$+3 indicate the bits of the terminal state that must be preset.

Once the terminal state and initial state have been determined, the logic circuitry required to actually perform the presetting can be specified. In all counter implementations this logic circuitry comprises a two input AND gate, a multiple input AND gate, and a flip-flop. In those counters requiring the clock pulse to be inhibited during the preset cycle an additional AND gate is required. The general form of the counter designed by the present invention is hence as shown in FIG. 1.

The counter is formed of as many interconnected stages as is required by the loop length. Each stage 10–14 is a single-input toggle flip-flop of the type well-known in the prior art. AND gate 15 is only present in those counters in which the clock pulse must be inhibited during the preset cycle. AND gate 16 is the sensing gate, that is, it provides an output signal when it senses that the terminal state has been reached. This output signal drives flip-flop 17 and also provides the counter's output signal at terminal 20. Flip-flop 17 is a clocked set-reset flip-flop of the kind well-known to the prior art. It is set by the presence of both the clock plus an output signal from gate 16 and is reset by inverter 18 by the absence of an output signal from gate 16. Flip-flop 17 insures that the output signal of gate 16 is of sufficient duration to allow the presetting to occur.

AND gate 19 is the setting gate. It generates an output signal upon the first occurrence of the clock signal after the terminal state has been detected by sense gate 16. The output signal of gate 19 is used to reset the appropriate counter stages.

The resetting function performed by AND gate 19 is straightforward and is completely defined by the bit positions of the "1's" in *J*, as has been described. The sensing function performed by AND gate 16 is more complex. The detection of a particular state in an N state counter normally requires an N input AND gate. The size of the gate may be reduced, however, when the direction of counting is known.

For example, consider the problem of detecting the state 1010 if it is known that counting always begins at 0000. A four-stage binary counter can be thought of as a counting in each of the four sectors 00XX, 01XX, 10XX, 11XX as defined by the two most significant bits. The detection of sector 10XX requires only a one input gate if counting begins at 0000. Further, XX10 occurs only once per sector, and, once the sector has been determined, requires only a one input gate. Hence the detection of 1010 requires only a two input gate.

The terminal state of a counter designed by the invention has most of its significant bits equal to one rather than zero, that is, the terminal state is in the last sector. Mathematically, this can be expessed by $2^S - X$, where X is a power of 2 greater than J. This allows the sensing circuitry to sense "1's" rather than "0's" and helps alleviate the aforementioned problem of the propagating ripple. It should be observed that since the terminal state is not zero, the initial state, formed by effectively adding *J* to the terminal state, will be greater than a number consisting of all "1's" at the positions greater than and equal to that of the most significant bit of *J*. For example, for terminal state 1100101 and *J* equal to 10010, their sum will be 1110111 which is greater than 1110000. Therefore, the sensing AND gate of counters designed by the invention must have as inputs all of the significant bits of the counter up to and including the bit position corresponding to the most significant bit of *J*. To summarize, the terminal state can be expressed by three equations, which account for the presence or absence of the clock and for the modifications made to the even and odd *J* values. Namely, when *L* is odd (clock inhibited) the terminal state is $2^S - X + 1$, when L is even divisible by 4 (clock uninhibited) the terminal state is $2^S - X + 1$, and when L is even not divisible by 4 (clock uninhibited) the terminal state is $2^S - X + 3$.

What is claimed is:

1. A clock driven ripple-through counter having a preselected odd value loop length L, for providing an output pulse with minimum propagation delay with respect to said clock comprising:

a binary ripple-through counter responsive to said clock comprising a cascade ordered interconnection of S stages of binary devices, each device having a single output, where S is the lowest integer satisfying the relation $2^S > L$, each of said ordered stages exhibiting a logic level which respectively corresponds to the associated binary digit value of the binary representation of a number;

a first AND gate solely connected to those of said binary devices which correspond to the location of logic level "1" in the binary representation of a number N defined by $2^S - X + 1$, where X is the lowest which satisfies the relation $X > 2^S - L + 1$;

means responsive to said first AND gate for reclocking said first AND gate output and for providing a true and an inverted output;

a second AND gate, responsive to said true output of said reclocking means and to said clock, for setting to logic level "1" only those of said binary devices which correspond to the location of logic level "1" in the binary representation of the number J defined by $2^S - L + 1$; and a third AND gate responsive to said inverted output of said reclocking means and to said clock for selectively applying said clock to the first stage of said binary ripple-through counter.

2. A clock driven ripple-through counter having a preselected even value loop length L which is divisible without a remainder by 4, for providing an output pulse with minimum propagation delay with respect to said clock comprising:

a binary ripple-through counter responsive to said clock comprising a cascade ordered interconnection of S stages of binary devices, each device having a single output, where S is the lowest integer satisfying the relation $2^S > L$, each of said ordered stages exhibiting a logic level which respectively corresponds to the associated binary digit value of the binary representation of a number;

a first AND gate solely connected to those of said binary devices which correspond to the location of logic level "1" in the binary representation of a number N defined by $2^S - X + 1$, where X is the lowest which satisfies the relation $X > 2^S - L$;

means responsive to said first AND gate for reclocking said first AND gate output and for providing a true and an inverted output; and a second AND gate, responsive to said true output of said reclocking means and to said clock, for setting to logic level "1" only those of said binary devices which correspond to the location of logic level "1" in the binary representation of the number J defined by $2^S - L$.

3. A clock driven ripple-through counter having a preselected even value loop length L which is not divisible without a remainder by 4 for providing an output pulse with minimum propagation delay with respect to said clock comprising:

a binary ripple-through counter responsive to said clock comprising a cascade ordered interconnection of S stages of binary devices, each device having a single output, where S is the lowest integer satisfying the relation $2^S > L$, each of said ordered stages exhibiting a logic level which respectively corresponds to the associated binary digit value of the binary representation of a number;

a first AND gate solely connected to those of said binary devices which correspond to the location of logic level "1" in the binary representation of a number N defined by $2^S - X + 3$, where X is the lowest which satisfies the relation $X > 2^S - L + 4$;

means responsive to said first AND gate for reclocking said first AND gate output and for providing a true and an inverted output; and a second AND gate, responsive to said true output of said reclocking means and to said clock, for setting to logic level "1" only those of said binary devices which correspond to the location of logic level "1" in the binary representation of the number J defined by $2^S-L+4$.

a second AND gate, responsive to said true output of said reclocking means and to said clock, for setting to logic level "1" only those of said binary devices which correspond to the location of logic level "1" in the binary representation of the number J defined by $2^S-L+4$.

* * * * *